Feb. 12, 1952 W. L. EVERITT 2,585,640

RADIO CONTROL SYSTEM

Original Filed Nov. 10, 1941 3 Sheets-Sheet 1

INVENTOR.
WILLIAM L. EVERITT
BY Mueller, Dodds & Mason
ATTORNEYS

Inventor:
William L. Everitt
By: Foorman L. Mueller Att'y.

Feb. 12, 1952 W. L. EVERITT 2,585,640

RADIO CONTROL SYSTEM

Original Filed Nov. 10, 1941 3 Sheets-Sheet 3

Inventor:
William L. Everitt
By- Freeman L. Mueller
Att'y.

Patented Feb. 12, 1952

2,585,640

UNITED STATES PATENT OFFICE 2,585,640

RADIO CONTROL SYSTEM

William L. Everitt, Urbana, Ill., assignor to Motorola, Inc., a corporation of Illinois Continuation of abandoned application Serial No. 418,506, November 10, 1941. This application July 23, 1945, Serial No. 606,656

25 Claims. (Cl. 250—20)

This invention relates generally to tuning systems for radio receiving apparatus and in particular to a tuning system of push button type which is adapted to automatically select from a band of frequencies the frequencies corresponding to the strongest stations within the tuning range of the receiving apparatus. This application is a continuation of application Serial No. 418,506, filed November 10, 1941, now abandoned.

In general the prior art tuning systems of push button type are manually adjustable for tuning in the desired stations in a particular locality. In radio receivers for home use this manual adjustment is substantially permanent except for the periodic attention required in maintaining correct the initial adjustments. However, in the case of portable or vehicle receivers which are frequently moved into zones of varying station reception, the push buttons, to be effective, must be readjusted to the stations which are receivable in the particular locality or zone. Since it is not uncommon during a day's travel to pass completely out of the receiving range of the stations to which the push buttons were originally adjusted, this manual adjusting of the push buttons is oftentimes so very inconvenient that the operator reverts to manual tuning until the stations to which the push buttons are tuned are again receivable. Another disadvantage in the push button tuning systems of the prior art is found in the fact that the number of stations which can be tuned in are limited in number to the number of push buttons which may be accommodated by the particular receiver.

It is an object of this invention, therefore, to provide an improved tuning system for radio receiving apparatus.

Yet another object of this invention is to provide an improved method and means for controlling controllable apparatus.

A further object of this invention is to provide an improved method for selecting stations for tuning.

A still further object of this invention is to provide a tuning system which operates automatically to select for tuning the strongest stations within the tuning range of the radio receiver.

Yet another object of this invention is to provide a tuning system for automatically tuning a radio receiver to the strongest signal which it is capable of receiving.

A still further object of this invention is to provide a tuning system for automatically tuning a radio receiver to only those stations the field strength of which is related in a predetermined ratio with the field strength of the strongest station within the tuning range of the radio receiver.

Yet a further object of this invention is to provide an improved tuning system which automatically selects for tuning only those stations having a field strength equal to or greater than a known indicia or standard field strength.

Another object of this invention is to provide a tuning system of push button type in which manual adjustment of the push buttons is entirely eliminated while retaining the advantage of push button tuning at all times of receiver operation regardless of the reception zone in which the receiver may be located.

A still further object of this invention is to provide a tuning system of push button type which is simple in design, rugged in construction and efficient in operation to automatically and accurately tune in selected stations without requiring any previous manual adjustments of the push buttons.

A particular feature of this invention is found in the provision of a tuning system in which a circuit adapted to have the voltage therein varied in accordance with the field strength of a signal being received is utilized to impress the highest voltage developed therein on a charge receiving device which retains the charge and functions as an indicia for indicating the relative strengths of the voltages developed in the circuit by the remaining signals. Actuating means for controlling the operation of the frequency changing means in the tuning system is connected to the charge receiving device and to the circuit in a manner to match or compare the relative strengths of the voltages therein. By setting the actuating means to operate when the voltage in the charging circuit is in a predetermined ratio with the voltage of the charge receiving means, the frequency changing means is operated to stop at the frequency corresponding to the signal strength which produces such ratio.

Yet another feature of this invention is found in the provision of a tuning system in which the usual AVC circuit is utilized to charge a condenser through a diode tube to the highest voltage produced in the AVC circuit over a complete band of frequencies. With the condenser disconnected from the AVC circuit and connected with a potential differentiating device, which is also connected with the AVC circuit, the difference in potential in the AVC circuit during the tuning over the band of frequencies is compared directly with the charge of the strongest signal on the condenser, with the difference in potential being utilized to determine a minimum field strength of the stations to be tuned in.

In accordance with another object of the invention, improved facilities are provided for automatically muting the system against signal reproduction while the signal selecting and tuning operations are in progress.

According to a still further object of the invention, the tuning system is so interconnected with the automatic frequency control facilities of the receiver that these facilities are automatically rendered inactive during the signal selecting and tuning operations.

Further objects, features and advantages of this invention will become apparent from the following description when taken in connection with the accompanying drawings in which.

In the practice of this invention there is provided a tuning system for a radio receiver including a usual AVC circuit, and frequency changing means operated by a reversible motor. The AVC circuit is selectively connected with a condenser, which in turn is selectively connected with the grid circuit of a gas tube. The plate of the gas tube is connectsd into a control circuit for the motor of the frequency changing means, while its cathode is connected into the AVC circuit. When the condenser is connected into the AVC circuit, the motor is operated to continuously move the frequency changing means in one direction over the complete frequency or tuning range. During this scanning of the frequency band the voltage of the strongest signal within the tuning range of the radio receiver as developed in the AVC circuit is impressed on the condenser which functions as an indicia with which voltage comparisons can be made. On completion of this scanning operation the condenser is disconnected from the AVC circuit and connected with the grid of the gas tube. On rotation of the frequency changing means in a direction opposite to its rotation for a scanning operation the voltages produced in the AVC circuit are compared in the gas tube with the voltage of the strongest signal impressed on the condenser.

The gas tube may be set to fire when the voltage in the condenser is equal to the voltage developed in the AVC circuit. Signals of a predetermined minimum field strength are thus selected by the tuning system, the gas tube on firing serving to operate the motor control circuit to stop the motor and hence the frequency changing means at the frequency position corresponding to the signal being received. Since the selection of a signal is dependent upon its field strength, the strongest signals in any locality can in this manner be selected for reception.

Figure 1:
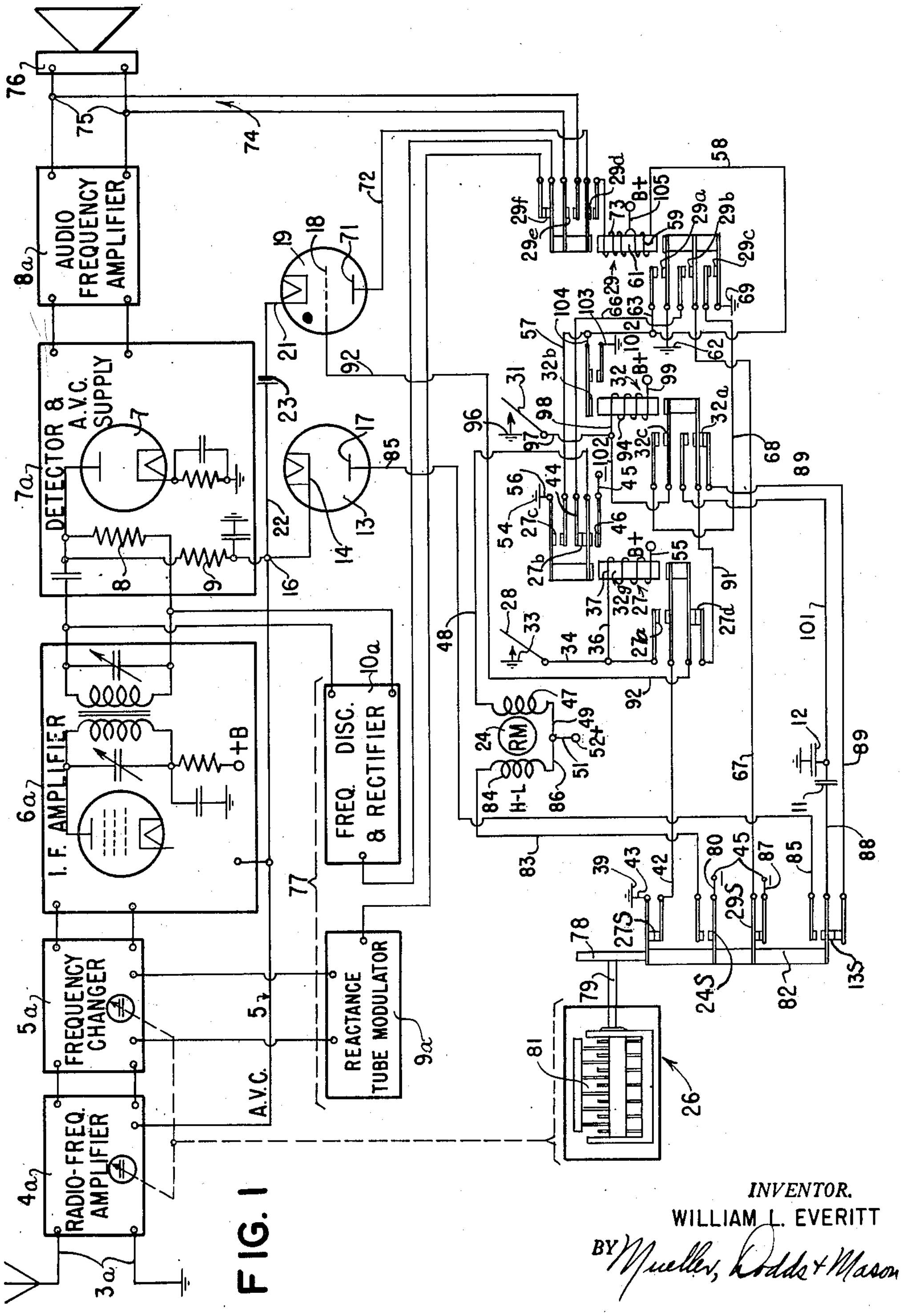
Fig. 1 illustrates diagrammatically a complete tuning system of this invention as applied to a radio receiver of the well-known superheterodyne type.

Referring now to the drawings and more particularly to Fig. 1 thereof, the present improved tuning system is there shown in its embodiment in a tunable wave signal receiver of the well known superheterodyne type. In brief, this receiver comprises an antenna-ground circuit 3a, a tunable radio frequency amplifier 4a, a frequency changer or mixer 5a, an intermediate frequency amplifier 6a, a detector and automatic amplification control or AVC supply 7a, an audio frequency amplifier 8a and a loud speaker 76 connected in cascade in the order named. Certain components of the intermediate frequency amplifier 6a and the detector and AVC supply 7a have been shown in detail for purposes of explaining the mode of operation of the present invention. Those parts of the system which have been illustrated schematically, however, may be conventional in their construction and operation, the details of which are well known in the art, rendering description thereof unnecessary herein.

Neglecting for the moment the particular arrangement and operation of the present improved tuning system, the above described receiver includes all of the features of a conventional superheterodyne receiver, the operation of which is well understood in the art. In brief, however, a desired amplitude modulated carrier signal intercepted by the antenna-ground circuit 3a is selected and amplified in the radio frequency amplifier 4a and converted by the frequency changer 5a into an intermediate frequency signal. This signal is selected and amplified by the intermediate frequency amplifier 6a and delivered to the detector and AVC supply 7a for resolution of the audio frequency components thereof. The audio frequency signal is in turn amplified by the audio frequency amplifier 8a and delivered to the loud speaker 76 for reproduction.

For the purpose of maintaining the local oscilator section of the frequency changer 5a tuned to an output frequency such that the carrier frequency of the intermediate frequency carrier traversing the amplifier 6a does not deviate substantially from the particular center frequency to which the selective circuits of this amplifier are tuned, automatic frequency control facilities are provided which may be of any conventional arrangement. Such facilities are indicated generally at 77 as comprising a frequency discriminator and rectifier 10a and a reactance tube modulator 9a connected between the output terminals of the intermediate frequency amplifier 6a and the modulating terminals of the frequency changer 5a. The mode of operation of these facilities is well understood in the art. Briefly, however, the reactance tube modulator 9a performs the function of changing the output frequency of the local oscillator embodied in the frequency changer 5a in accordance with the bias voltage impressed between the input electrodes of the modulator tube and derived from the frequency discriminator and rectifier 10a. The latter unit performs the function of developing a bias voltage which changes in polarity and magnitude in response to deviation in the carrier frequency of an intermediate frequency signal traversing the intermediate frequency section 6a of the receiver from the particular center frequency to which the selective circuits of this receiver section are tuned. Accordingly, if the carrier frequency of an intermediate frequency signal carrier departs in one sense from the particular intermediate frequency indicated, a bias voltage of corresponding polarity and proportional in magnitude to the degree of frequency deviation is developed at the output side of the frequency discriminator and rectifier 10a for application between the input electrodes of the reactance tube included in the modulator 9a, thereby to change the output frequency of the local oscillator in the frequency changer 5a in the correct sense to reduce the indicated frequency departure of the intermediate frequency carrier. The converse action occurs when the departure in carrier frequency is of the opposite sense from the particular center frequency to which the selective circuits of the intermediate frequency amplifier 6a are tuned. Thus the described automatic frequency control means 77 performs the desired function of minimizing variations in the frequency of intermediate frequency carriers traversing the intermediate frequency section of the receiver.

Referring now more particularly to the automatic amplifier control means, there is illustrated in Fig. 1 a AVC circuit of well-known type designated generally as 5, which is connected with the intermediate frequency amplifier 6a of the receiver. A diode detector tube 7 is connected in the AVC circuit such that the direct current component of its plate current flows through a resistor 8, with the voltage drop obtained in the resistor 8 being utilized, as through the resistor 9, to vary the grid bias applied to the RF amplifier tubes (not shown) and so vary the amplification. A stronger signal strength tends to increase this direct current and change the voltage drop across the resistor 8. The bias voltage applied through resistor 9 which is connected to the control grid circuits of the RF tubes is correspondingly changed so as to effect a decrease in the amplification. The AVC circuit 5 is utilized to charge a pair of series condensers 11 and 12 through a diode tube 13, having its cathode 14 connected into the AVC circuit at 16 and the plate 17 thereof adapted to be connected with the condensers 11 and 12 to charge the same.

In order to select the signals or stations which are to be tuned in, the tuning range of the receiver is first scanned while the AVC circuit is in a charging relation with the condensers 11 and 12 to provide for the application on the condensers 11 and 12 of the maximum voltage developed in the AVC circuit. The condensers are then connected, as will be later described, with the grid 18 of a gas tube 19 which in turn has its cathode 21 connected to the AVC circuit through conductor 22 having a battery or bias potential 23 therein. The battery 23 is capable of receiving the maximum voltage developed in the AVC circuit. When this maximum voltage is impressed on the battery 23, the potential of the grid 18 is equal to the potential on the cathode 21 and the tube 19 is fired to operate a control circuit for a reversible motor 24, which operates the frequency changing means 26 for the receiver, illustrated as of condenser type. It is to be understood, however, that other types of frequency changing means may be used equally well in the receiving system. This control circuit includes a relay 27 having an actuator or push button 28, a relay 32, with an associated push button 31, and a third relay 29 associated with both relays 27 and 32 and responsive in operation to the energization of such two relays.

The relay 27 is comprised of a solenoid 32g and contacts 27a—27d, the solenoid being energized on closing of the push button 28 with the closing circuit from the ground 33 being comprised of push button 28, conductors 34 and 36, and a solenoid winding 37 which is connected to a B+ terminal 55 in the receiving circuit. Contacts 27a and 27c are normally open with contact 27d being normally closed. On energization of the solenoid 32g, therefore, contact 27a is closed to connect winding 37 to ground 39 through conductor 36, contact 27a, conductor 42, cam switch 27S and conductor 43, this circuit shorting the button 28 and locking the relay 27. Contact 27b which is normally engaged with a terminal 44, to be later noted, is closed with terminal 46 indicated as being connected to the negative terminal 45 of a usual car battery (not shown). This closes a circuit for the motor 24 through a field winding 47, the circuit from the terminal 46 including contact 27b, conductor 48, winding 47, and conductors 49 and 51 to the positive battery terminal 52. Energization of the winding 47 rotates the motor 24 such that the frequency changing means 26 is moved in a direction from the low to the high frequency end of the frequency band. The normally closed contact 27d is opened to in turn open the circuit to the grid 18 of the gas tube 19 which will be later described. Contact 27c closes a circuit from the ground 54 through conductor 56, contact 27c, conductors 57 and 58, winding 59 of the operating solenoid 61 for relay 29 to a B+ connection 105.

Energization of the winding 59 operates the relay 29 which is comprised of normally open contacts 29a—29e, and a normally closed contact 29f. When the relay 29 is energized by closing of the contact 27c in the relay 27, the closing of contact 29a locks the relay 29 through a closed circuit formed by the connection of contact 29a to the ground at 62, contact 29a, conductors 63 and 58, and winding 59 to the B+ terminal 105. The contact 29b on closing produces no immediate operating effect and merely connects conductor 66 leading to the terminal 44 and conductor 67 connected with cam switch 29S for a purpose to be later described. The contact 29c connects conductor 68 with the ground 69, the remainder of the circuit being open through contact 32c in the relay 32. Contact 29c, therefore, although closed on energization of relay 29, is without function when the relay 29 is energized as a result of the prior operation of the relay 27. Contact 29d completes a circuit to the plate 71 of the gas tube 19 through conductor 72, contact 29d, and winding 73 to the B+ terminal 105. The windings 59 and 73 are reversely wound on the solenoid 61 so as to produce magnetic fields which are in opposition to each other. Contact 29e is arranged in a circuit 74 for a loud speaker 76 having terminals 75 for connection into the radio receiver circuit, and operates to short circuit the loud speaker 76 when the relay 29 is energized. Contact 29f is included in the AFC (automatic frequency control) circuit 77 which functions to pull in for accurate tuning the signal selected for hearing in the manner explained above. This circuit is inoperative whenever contact 29f is opened.

On actuation of the push button 28, therefore, the driving motor 24 for the frequency changing means 26 is conditioned to move the frequency changing means toward the high frequency end thereof, while the plate circuit of the gas tube 19 is completed through the relay 29, which also operates the contacts 29e and 29f for the loud speaker and AFC circuits, respectively, to make these circuits inoperative.

As mentioned above, energizing of the winding 47 rotates the motor 24 to move the frequency changing means 26 toward its high frequency end. When the high frequency end of the frequency band is reached a cam 78 on the shaft 79 for the tuning condensers 81 in the frequency changing means 26, operates a follower 82 which permits the cam switch 27S for the relay 27 to move out of contact with conductor 42; the switch 24S which is connected by conductor 80 to the negative terminal 45 to move into contact with conductor 83 which is connected in series with motor winding 84, conductors 86 and 51 and positive terminal 52; switch 29S for the relay 29 to move out of contact with the connection 87 to the negative terminal 45; and the switch 13S for the matching or comparison condensers 11 and 12 to open the grid circuit of the gas tube 19, to be later described, and connect the condensers 11 and 12 with the plate 17 of the charging diode tube 13. The movement of the switch 27S to its open position opens the locking circuit for the relay 27 to release the same, the relay 29 remaining closed by virtue of its locking circuit through the contact 29$a$. The switch 29S breaks the connection of the conductor 67 with the conductor 87 which is connected with negative terminal 45. If the switch 29S was retained closed, the release of the relay 27 would close a circuit for the motor winding 47, through the contact 27$b$ which, as was previously mentioned, is normally closed with the terminal 44. With the cam switch 24S connected with the negative terminal 45 through conductor 80, a circuit is closed through the motor field winding 84 from the terminal 45, through conductor 80, switch 24S, conductor 83, field winding 84 and conductors 86 and 51 to the positive terminal 52. Energization of the winding 84 rotates the motor 24 in a direction such that the frequency changing means 26 is moved from the high to the low frequency end thereof. Switch 13S connects the plate 17 of the tube 13 in series with the condensers 11 and 12 through conductors 85 and 88 to provide for their being charged from the AVC circuit 5.

Thus when the frequency changing means 26 is in a home position at the high frequency end of the tuning band, the condensers 11 and 12 are arranged for charging by the AVC circuit, with the loud speaker and AFC circuits continuing to be inoperative, the plate circuit of the gas tube remaining closed through the relay 29, and the motor set to move the frequency changing means to the low end of the frequency band. With the tuning system thus operated the frequency band is scanned in a direction from the high to the low frequency end thereof, with the maximum voltage produced in the AVC circuit during this scanning procedure being applied to the condensers 11 and 12 to charge the same to such maximum voltage.

When the low end of the frequency band is reached, the cam switches 13S, 24S, 27S and 29S are simultaneously moved by the cam 78 on the condenser shaft 79 to their initial operating positions. The switch 13S thus connects the condensers 11 and 12 with the grid 18 of the gas tube 19 through conductor 88, switch 13S, conductor 89, contact 32$a$ of relay 32, conductor 91, normally closed contact 27$d$ of relay 27, and conductor 92 to the grid 18. The switch 24S opens the energizing circuit for the motor field winding 84. However, since the switch 29S connects the conductor 67 with the negative terminal 45 through conductor 87, the circuit for the winding 47 is completed from the terminal 45, through conductor 87, switch 29S, conductor 67, closed contact 29$b$, conductor 66 to terminal 44, through contact 27$b$, conductor 48, winding 47 and conductors 49 and 51 to the positive terminal 52. The energization of the winding 47 rotates the motor 24 to again move the frequency changing means 26 from the low to the high frequency end of the tuning band. The switch 27S is reconnected with the conductor 42 so as to be in a position for closing the locking circuit for the relay 27 when the push button 28 is later actuated.

Thus, with the frequency changing means at the low frequency end of the tuning band, the motor is conditioned to move the frequency changing means toward the high frequency end of the frequency band, with the highest charge produced in the AVC circuit during the scanning procedure being retained by the condensers 11 and 12 which are connected with the grid 18 of the gas tube 19 and now function as an electrical indicia to which the voltages developed in the AVC circuit can be compared. The plate circuit of the gas tube continues to be closed through the relay 29, with the contacts 29$e$ and 29$f$ continuing to retain inoperative the loud speaker and AFC circuits, respectively. With the tuning system thus operated, the frequency changing means is tuned in a direction opposite to its movement during scanning, with the voltages developed in the AVC circuit by the received signals being applied on the bias potential 23 for comparison with the known voltage of the condensers 11 and 12 in the gas tube 19.

Assuming the gas tube 19 to be set to fire when the potential of the circuit for the cathode 21 including the conductor 22 and bias battery 23 is equal to the potential of the condensers 11 and 12, the frequency changing means will move continuously toward the high frequency end of the frequency band until the signal which produced the maximum voltage in the AVC circuit is received. When this signal is reached the gas tube will fire and set up a current in the plate circuit of the gas tube which energizes the winding 73 of the solenoid 61, an amount sufficient to overcome the magnetic effects of the winding 59. The relay 29 is thus released opening the contacts 29$a$ and 29$b$ and stopping the rotation of the motor 24. The gas tube 19 thus serves as a means for actuating the control circuit for the frequency changing means when the desired signal is received. Contact 29$f$ is closed on release of the relay 29 to permit the AFC circuit to operate to accurately pull in the strongest signal, while contact 29$e$ is opened to permit the loud speaker 76 to function. On actuation of the push button 28, therefore, it is seen that the system provides for the tuning in of the strongest signal within the tuning range of the radio receiver with such tuning being entirely automatic and completely free of any manual adjusting.

In the operation of the tuning system of Fig. 1 to receive signals of lesser strength than the strongest signal capable of being received, the push button 28 is actuated and the system is operated in all respects in the manner just described. In other words, prior to the tuning in of the signals of lesser strength, the signal of greatest strength is tuned and the condensers 11 and 12 retain the charge of the maximum voltage developed in the AVC circuit during such tuning operation. In order to tune in a station of lesser strength, the push button 31 for the relay 32 is actuated, the energizing circuit for the solenoid winding 94 comprising the ground connection 96, push button 31, conductors 97 and 98, winding 94 and a B+ connection 99. Relay 32 is comprised of contacts 32$a$—32$c$. On closing of the relay 32 the contact 32$a$ which on the operation of relay 27 connected the conductor 91 with the conductor 89 to apply the capacity of both condensers 11 and 12 to the grid 18 of the gas tube is moved to connect the conductor 91 with the conductor 101 to apply only the capacity of the condenser 12 to the grid 18 of the gas tube. It is to be understood, of course, that the capacity of condenser 12 is in a predetermined ratio relative to the combined capacities of condensers 11 and 12. Since the gas tube 19 will fire whenever the voltage developed in the AVC circuit is equal to or greater than the voltage applied on the grid 18, it is evident that the tube will fire for all signals received having a field strength capable of developing a voltage in the AVC circuit which is greater than the voltage of the condenser 12 alone. With the grid 18 connected only with the condenser 12 the tube 19 would thus also fire for the strongest signal within the tuning range of the radio receiver.

Contact 32*c* is in the locking circuit for the relay 32 which includes contact 29*c* of relay 29, conductor 68, contact 32*c*, conductors 102 and 98, winding 94, and the B+ connection 99. The closing of contact 32*b* energizes the circuit for the winding 59 of the relay 29, this circuit from the grounded connection 103 including contact 32*b*, conductors 104 and 58, winding 59 and the B+ connection 105. Energization of this winding, of course, closes the relay 29 to operate the contacts 29*a*–29*f* thereof in the manner above fully described. On closing of contact 29*c* the locking circuit for the relay 32 is completed so that the relay 32 remains closed on later release of the push button 31.

With the relay 27 released the motor winding 47 is energized through the circuit including the conductor 87 connected to the negative terminal 45, switch 29S, conductor 67, contact 29*b*, conductor 66, terminal 44, contact 27*b* of relay 27, conductor 48, winding 47, and conductors 49 and 51 to the positive terminal 52. The motor 24 is thus conditioned to rotate the frequency changing means 26 toward the high frequency end of the tuning band. As the frequency changing means is rotated in this direction each time a signal is received which produces or develops a voltage in the AVC circuit which is greater than or equal to the voltage of the condenser 12, the gas tube 19 fires to release the relay 29 and stop the motor 24 as was above fully described. This tuning in of a signal of a lesser field strength than the strongest signal received occurs each time that the push button 31 is actuated.

On repeated actuation of the push button 31 it is obvious that the frequency changing means 26 will be progressively moved to the high frequency end of the tuning band. When this high end is reached the cam 78 on the condenser shaft 79 actuates the cam switches 13S, 24S, 27S and 29S, to positions providing for the scanning operation of the frequency changing means and the charging of the condensers 11 and 12, as was fully explained above. Thus when the frequency changing means 26 is in its home position at the low end of the frequency band the condensers 11 and 12 are charged to a voltage corresponding to the strongest signal capable of being received, and the cam switches 13S, 24S, 27S and 29S are actuated to again set the system for normal tuning. Thus regardless of the position in the frequency band of the strongest signal to be received, a repeated actuation of the push button 31 tunes in all stations, of lesser strength than the strongest signal, but having a predetermined minimum field strength which corresponds to the voltage charge on the condenser 12. By virtue of the tuning taking place progressively from the low to the high frequency end of the frequency band, it is evident that signals to both sides of the strongest signal will be tuned in before the strong signal is again received. In other words, the tuning in of the signals takes place progressively for one direction of movement of the frequency changing means, with the condensers 11 and 12 being charged when the frequency changing means is moved in an opposite direction.

Figure 2:
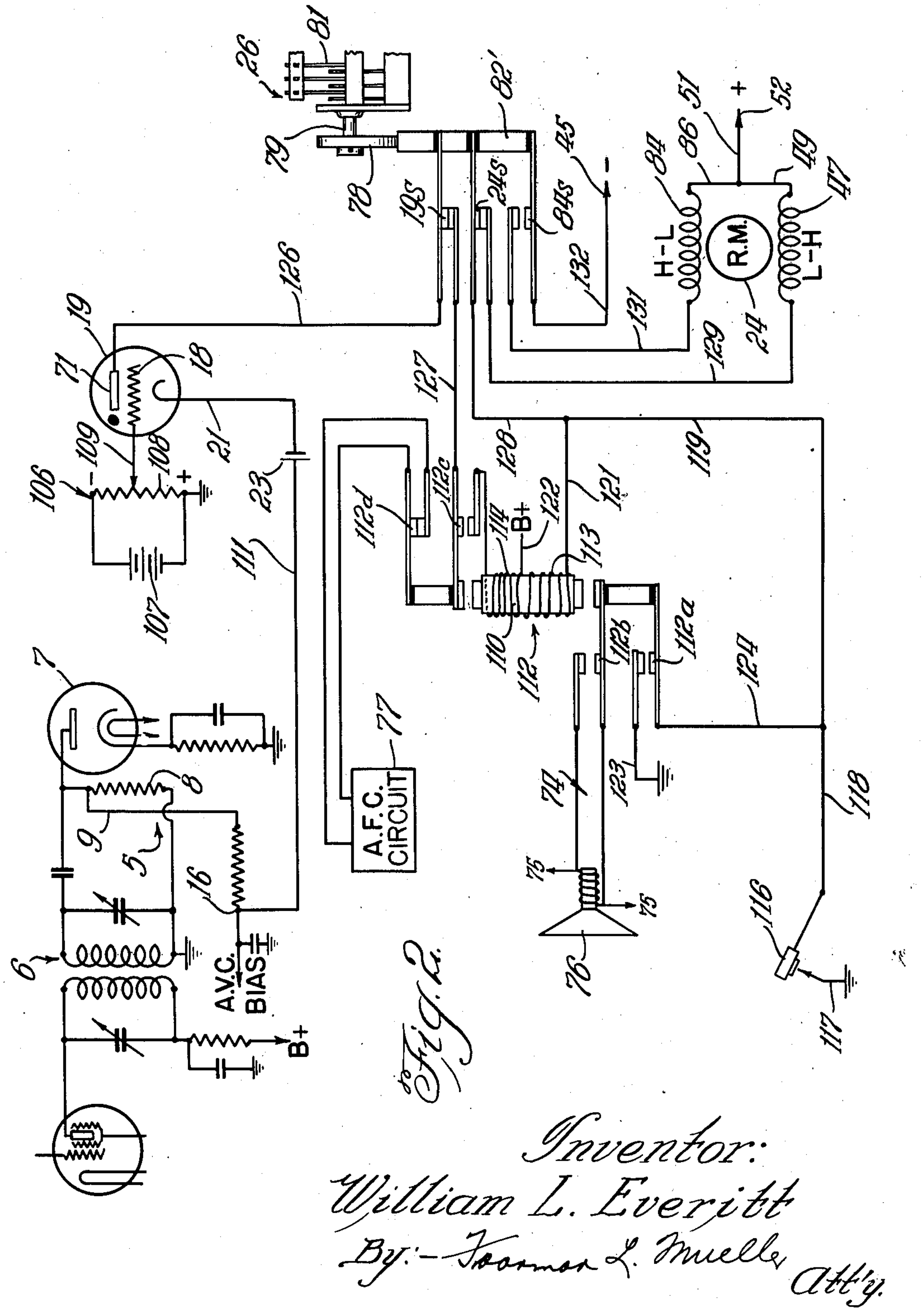
Fig. 2 illustrates another form of the invention.

Although the tuning system in Fig. 1 has been described with reference to a voltage applied on the condensers 11 and 12 which is provided by the maximum voltage developed in the AVC circuit, the system will operate equally well if the condensers 11 and 12 were charged to some predetermined value from a source independent of the radio receiver, or if a battery or the like were used as an indicia in place of the condensers, as shown in Fig. 2. The advantage of using the condensers 11 and 12 and charging them in the manner shown in Fig. 1 is that this scheme serves as an automatic memory device to establish and maintain a reference potential indicative of the strongest signal within the band, and during the subsequent tuning of the set this retained indication governs the selection of a signal or signals by the set.

Many parts in the system of Fig. 2 are similar in all respects to the corresponding parts in Fig. 1 so like numerals are used to designate like parts. The grid 18 of tube 19 is adapted to have a variable voltage applied thereon by means of its connection with potentiometer means designated generally as 106 and including a battery 107 connected in series with a resistance 108, a potentiometer arm 109 connected to the grid 18 being movable over the resistance 108 to vary the potential applied on the grid to any predetermined value. Although the potentiometer means is illustrated as being excited by a battery, it is readily understandable that it may be excited equally well from the B supply of the radio receiver or from some rectified current from the oscillator circuit. The cathode 21 of the tube 19 is connected through conductor 111 with the AVC circuit at the point 16, so that the voltage developed in the AVC circuit corresponding to the field strength of the signal being received will be applied to the cathode 21 through the potential bias 23. The voltage applied on the grid 18 is set at some predetermined value by the potentiometer means 106 so that the gas tube 19 will fire whenever the voltage impressed on the cathode 21 from the AVC circuit is equal to or greater than the predetermined voltage level on the grid 18, the potentiometer means 106 functioning as a voltage level control or indicia to which the voltages developed in the AVC circuit can be compared.

Tube 19 is utilized as an actuating device for operating a control circuit for the frequency changing means 26. This control circuit includes a relay 112 comprised of a solenoid 110 having windings 113 and 114 arranged so that the magnetic fields set up thereby are in opposition, and contacts 112*a*—112*d*. The relay 112 is actuated by a push button 116 having the portion 117 thereof connected to ground, the relay closing circuit from the ground connection 117 including the push button 116, conductors 118, 119 and 121, winding 113 and the B+ connection 122. Closing of contact 112*a* closes a locking circuit for the relay 112 which includes a ground connection 123, contact 112*a*, conductors 124, 119 and 121, winding 113, and the B+ connection 122. The closing of contact 112b shorts the circuit 74 for the loud speaker 76. Contact 112d is normally closed and on energization of the relay 112 opens to disconnect the AFC circuit 77. Contact 112c which is normally open, closes on energization of the relay 112 to connect the plate 71 of the gas tube 19 into the control circuit through conductor 126, cam switch 19S, conductor 127, contact 112c, winding 114 and the B+ connection 122.

Similarly to the tuning system of Fig. 1, the system shown in Fig. 2 is adapted to tune in stations when the frequency changing means 26 is moving toward a home position at the high frequency end of the frequency band and to scan the frequency band on moving of the frequency changing means to a home position at the low end of the frequency band. The tuning in of the stations, therefore, is accomplished progressively from the low frequency toward the high frequency end of the frequency group. By virtue of this operation of the control circuit the motor 24 is always conditioned to rotate in a direction to move the frequency changing means 26 toward the high frequency end thereof whenever the relay 112 is initially energized. The energizing circuit for the motor winding 47 which effects this direction of rotation of the motor 24 includes the ground connection 123, contact 112a, conductors 124, 119 and 128, cam switch 24S, conductor 129, winding 47, conductor 49 and the connection 51 to the positive terminal 52. It is understood, of course, that prior to the energization of the relay 112 and specifically the closing of the contact 112a, that the winding 47 is energized by the connection of the conductor 119 to the ground 117 through the conductor 118 and push button 116.

On closing of the push button 116, therefore, it is seen that the loud speaker and AFC circuits are rendered inoperative while the control circuit is conditioned to rotate the frequency changing means toward the high frequency end of the frequency band concurrently with the connecting of the plate 71 of the gas tube 19 into the control circuit. The rotation of the motor 24 continues in this direction until a signal is received which develops a voltage in the AVC circuit which is greater than or equal to the voltage applied on the grid 18 of the gas tube 19 from the potentiometer means or level control 106. When this signal is received the gas tube 19 fires and sends a current through conductor 126, switch 19S, conductor 127, contact 112c through the winding 114 to the B+ connection 122. This current creates a magnetic effect in the winding 114 which overcomes the magnetic effect of the winding 113 to release or unlock the relay 112. The tube 19 thus serves as actuating means for operating the control circuit. Since the release of the relay 112 opens contact 112a, the circuit to the motor winding 47 opens stopping the motor 24 and hence the frequency changing means 26 at a frequency corresponding to the signal which effected the firing of the gas tube 19. A similar operation of the system of Fig. 2 will occur each time the push button 116 is operated.

When, on actuation of the push button 116 the frequency changing means 118 is moved to a home position at the high frequency end of the frequency group, the cam 78 on the condenser shaft 79 for the frequency changing means 26 operates the switch 24S to open the circuit of the winding 47 and the switch 84S to close the circuit for the winding 84, this latter circuit from the connection 51 to the positive terminal 52 being comprised of conductor 86, winding 84, conductor 131, switch 84S and connection 132 to the negative terminal 45. Energization of the field 84 rotates the motor 24 to move the frequency changing means toward the low frequency end of the frequency band. Simultaneously with the action of the switches 24S and 84S, the cam switch 19S is operated to open the plate circuit of the tube 19. The tube 19 is thus rendered ineffective to fire when the frequency changing means is being moved from the high to the low frequency end of the frequency band. When the low frequency end is reached, the cam switches 19S, 24S, and 84S are simultaneously moved to their initial positions so as to set the system for normal tuning. As the frequency changing means moves toward the high end of the frequency band, the first signal received having a field strength which develops a voltage in the AVC circuit equal to or greater than the potential on the grid 18 will fire the tube 19 to open the relay 112. A repeated actuation of the push button 116 thus progressively selects stations of increasing frequency, the frequency changing means 26 being returned to the low frequency end of the frequency band in the manner above described upon its reaching a home position at the high frequency end of the band.

Figure 3:
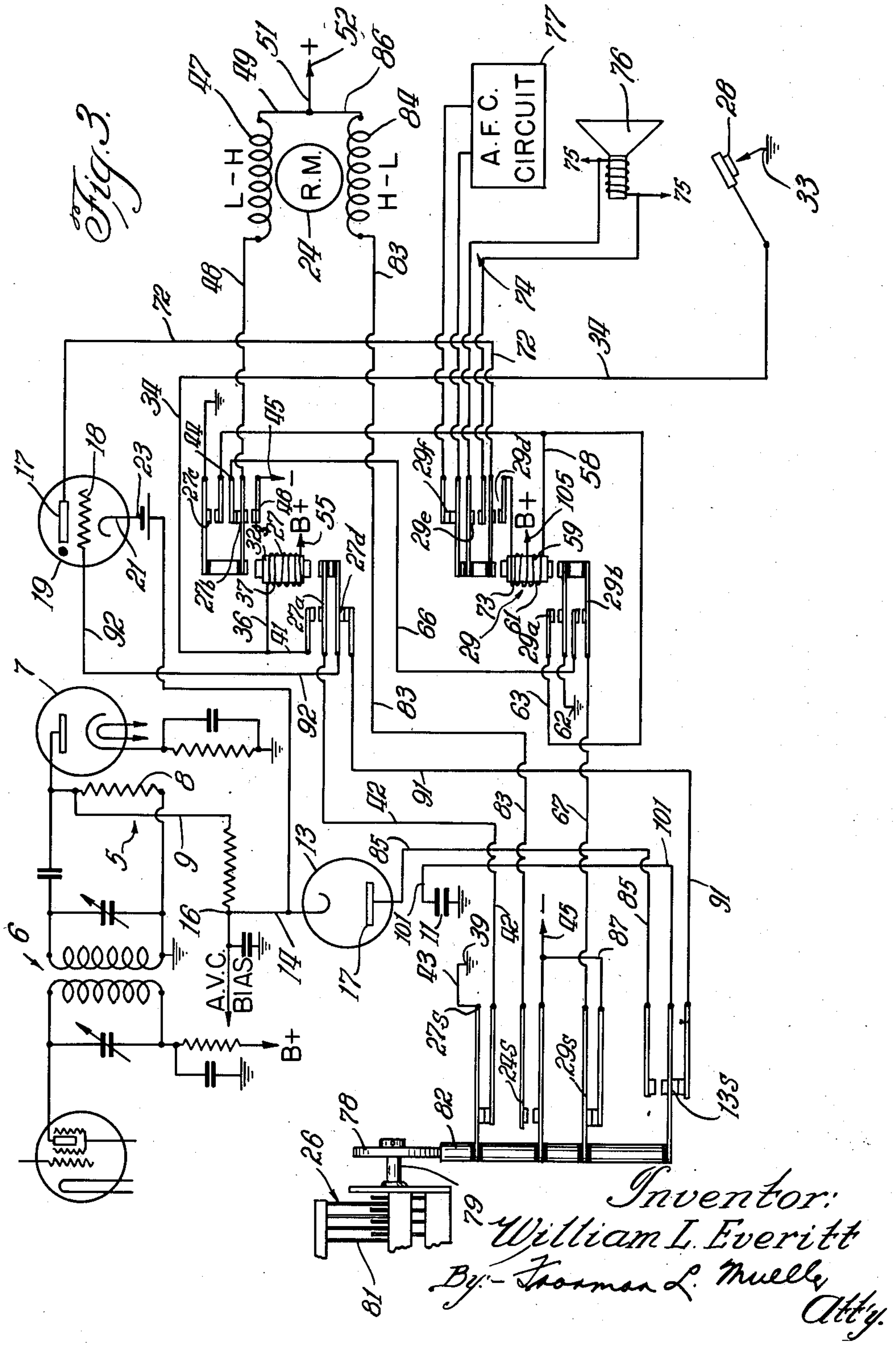
Fig. 3 illustrates yet another modification of the tuning system of this invention.

Yet another modified form of the invention is shown in Fig. 3 which is substantially similar in all respects to the tuning system shown in Fig. 1 except for the elimination of the relay 32 and one of the condensers 11 and 12. Similar numerals, therefore, will be used in the description of the system in Fig. 3 to designate parts thereof corresponding to the similar parts in Fig. 1. As was previously fully described, the system of Fig. 1 on actuation of the push button 28 for the relay 27 is adapted to first automatically tune in the strongest station which can be received, and then on actuation of the push button 31 for the relay 32 to tune stations of lesser field strength which are selected by comparing their field strengths to the field strength of the strongest station. The tuning system in Fig. 3, however, by virtue of the elimination of the relay 32 functions to tune in only the strongest signal which can be received.

As illustrated in Fig. 3, the system is in a tuning position. On actuation of the push button 28 the relays 27 and 29 are operated in a manner similar to that fully described in connection with Fig. 1, so that further explanation thereof is believed to be unnecessary. Energization of the relays 27 and 29 provides for a rotation of the motor 24 such that the frequency changing means 26 is moved toward the home position at the high frequency end of the frequency band. On reaching this home position the cam 78 on the condenser shaft 79 actuates the cam switch 13S to open the circuit from the condenser 11 to the grid 18 of the gas tube 19 and to connect the condenser 11 with the plate 17 of the diode tube 13 so as to be charged therefrom. Concurrently with the moving of the switch 13S, cam switch 27S is actuated to open the locking circuit for the relay 27; cam switch 24S is closed to energize the circuit for the motor winding 84; and cam switch 29S is opened to break the connection of the contact 29b with the negative terminal 45. It is seen, therefore, that the gas tube 19 is inoperative to effect any opening of the control circuit for the frequency changing means 26 and that the condenser 11 is connected by charging from the AVC circuit concurrently with a moving of the frequency changing means from the high toward the low end of the frequency band.

When the low end of the frequency band is reached the cam switches 13S, 24S, 27S and 29S are concurrently moved to their initial positions for tuning operation by the cam 78. As a result of this movement of the cam switches the condenser 11 is again connected wtih the grid 18 of the gas tube 19. Thus as the frequency changing means is reversed to move toward the high frequency end of the frequency band, the condenser 11 is charged to a voltage corresponding to the field strength of the strongest signal which can be received, and connected with the grid 18 of the tube 19 so that the known charge on the condenser can be compared with the potential bias applied on the cathode 21 from the AVC circuit 5. Thus when a voltage equal to or greater than the charge on the condenser 11 is developed in the AVC circuit and applied on the cathode 21, the gas tube fires and thus sends a current through the conductor 72, contact 29*d* and winding 73 to the B+ connection 55 to produce a magnetic effect in the winding 73 which overcomes the magnetic effect in the winding 59 and thus releases the relay 29. It is evident, of course, that since the condenser 11 was previously charged with the voltage of the strongest signal, that only such signal will be capable of firing the gas tube 19, since all other signals received will have a field strength which develops a voltage in the AVC circuit less than the voltage impressed on the grid 18 by the condenser 11. As a result, each actuation of the button 28 will provide for only the tuning in of the strongest signal in the frequency group.

From a consideration of the above description and drawings, it is seen that the invention provides a tuning system which is completely automatic in operation to select stations of a predetermined minimum field strength for any locality in which the radio receiver may be operated. There is no set number of signals to be received, since the selection of the signals is based entirely on the minimum field strength of the signal to be received, this selection being determined by tuning the signals to a predetermined electrical indicia. This electrical indicia may be created by utilization of the AVC circuit, or a battery or the like of known potential, may be used. The system is readily adapted to provide for the tuning in of only the strongest signal which can be received, or for any number of signals including the strongest signal having a field strength above a predetermined known minimum value. The system requires a maximum of only two push buttons capable of being compactly assembly in a minimum of space so as to be readily applicable for installation in either home or vehicle receiving sets. Although the tuning systems have been described as utilizing a usual car battery, it is to be understood that it will operate equally well from any source of electricity which may be substituted for the battery.

Although the invention has been described with respect to several preferred embodiments thereof, it is to be understood that the parts thereof can be changed or relatively arranged in a manner which is within the scope of this invention as defined by the appended claims.

I claim:

1. In a tuning system for radio apparatus including an automatic volume control circuit, the combination of means for selecting from a group of signals those signals having field strengths each stronger than a predetermined minimum including a control circuit having electrical charge comparing means therein, means electrically connecting said charge comparing means with said automatic volume control circuit, charge receiving means, means for scanning said group of signals and for selectively charging said charge receiving means to a voltage produced in said automatic volume control circuit by the strongest signal of said group and means for applying a predetermined part of the voltage on said charge receiving means to said charge comparing means, said charge comparing means determining the signals developing a voltage in said automatic volume control circuit equal to or greater than said predetermined part of the voltage on said charge receiving means.

2. In a tuning system for radio apparatus including frequency changing means, the combination of means for selecting the strongest signal from a group of signals including a charging circuit adapted to develop a voltage therein corresponding to the field strength of a signal being received, electrical charge receiving means, a control circuit for said frequency changing means, actuating means for said control circuit connected with said charging circuit, means selectively connecting said charge receiving means with said charging circuit and with said actuating means, means in said control circuit providing for a scanning of said signals when the charge receiving means is connected with said charging circuit, so that the voltage corresponding to the field strength of the strongest signal in the group is impressed on said charge receiving means, and means in said control circuit providing for operation of said frequency changing means when the charge receiving means is connected with said actuating means, said actuating means, when a voltage from said charging circuit corresponding to said strongest signal is impressed thereon, operating said control circuit to retain said frequency changing means in a position for tuning in said strongest signal.

3. In combination with a radio receiving system which is tunable to receive any one of a plurality of signals in a band of frequencies, frequency changing means, means for operating said frequency changing means to repeatedly tune said system over said band, a charging circuit in which the voltage is varied in response to the field strength of the signal being received, means for receiving a charge from said circuit corresponding to the voltage developed in said charging circuit by the strongest signal, a control circuit for said frequency changing means including a gas tube connected with said charging circuit and selectively connectible with said charge receiving means to compare the difference in voltage therebetween, and means for connecting said charge receiving means with said charging circuit during a first tuning operation of said frequency changing means and for connecting said charge receiving means with said gas tube during a second tuning operation of said frequency changing means, said control circuit having portions so arranged that said gas tube is conditioned by said charge receiving means to be fired in response to a signal of predetermined strength during the second tuning operation, and also having portions effective when said tube is fired to stop said frequency changing means at a tuning position corresponding to said signal of predetermined strength.

4. In a wave signal receiving system which includes frequency changing means for tuning the system over a predetermined frequency band, a circuit interconnected with said system to have a voltage developed therein corresponding to the field strength of any received signal, means for operating said frequency changing means to tune said system from one end of said band to the other and to then return said system over at least a portion of said band, condenser means connected to be charged by the voltage developed in said circuit during the tuning of said system from said one end of said band to the other, and means controlled in accordance with the charge thus applied to said condenser means during said tuning operation for arresting the operation of said frequency changing means when said system is returned to receive a predetermined signal within said band.

5. In a wave signal receiving system which includes frequency changing means for tuning the system over a band of frequencies, a circuit interconnected with said system to have a voltage developed therein corresponding to the field strength of any received signal, means for operating said frequency changing means to tune said system from one end of said band to the other and to then retune said system over at least a portion of said band, condenser means connected to be charged by the voltage developed in said circuit during the tuning of said system from said one end of said band to the other, means for comparing the voltage developed in said circuit during the retuning operation with the voltage to which said condenser means is charged by said circuit during the tuning of said system from one end of said band to the other, and means controlled by said comparing means for arresting the operation of said frequency changing means when the voltage developed in said circuit equals or exceeds the voltage to which said condenser means is charged, thereby to tune said system for the reception of a predetermined signal.

6. In a wave signal receiving system which is tunable over a predetermined frequency band to receive any one of a group of signals, means for tuning said system from one end of said band to the other and for then retuning said system over a portion of said band, automatic signal-responsive means for selecting and retaining an indication corresponding to the amplitude of the signal of greatest field strength in said group of signals incident to and simultaneously with the tuning of said system from said one end of said band to the other, and means controlled by said last-named means for automatically arresting said retuning operation when said system is tuned to receive said signal of greatest field strength.

7. In a wave signal receiving system which includes automatic gain control means and is tunable to receive any one of a group of signals, means controlled by said gain control means for successively scanning said signals of said group and testing the field strengths thereof and for retaining an indication of the amplitude of the signal of greatest field strength in said group of signals incident to and commencing simultaneously with said testing operation, and means controlled by said last-named means for automatically tuning said system for the reception of a signal of the indicated amplitude.

8. In a wave signal receiving system which is tunable to receive any one of a group of signals, a pair of manually operable devices, means responsive to operation of one of said devices for successively testing the field strengths of said signals and including an automatic signal-responsive device for retaining an indication of the amplitude of the signal of said group having greatest field strength, means controlled by said last-named means for automatically tuning said system for the reception of said indicated signal, and means responsive to the repeated operation of the other of said devices and including at least portions of said two last-named means for automatically and successively tuning said system for the reception of different ones of said signals having amplitudes greater than a predetermined portion of said indicated amplitude.

9. In a wave signal receiving system which is tunable to receive any one of a group of signals, means for testing the field strengths of said signals and including a signal-responsive device for selecting and retaining an indication of the amplitude of the signal of said group which has the greatest field strength, a manually operable device, and automatic means controlled by said first-named means in accordance with said indication and responsive to the repeated operation of said device for automatically and successively tuning said system for the reception of different ones of said signals having amplitudes greater than a predetermined portion of said indicated amplitude.

10. In a wave signal receiving system which is tunable over a predetermined frequency band to receive any one of a group of signals having frequencies within said band, means for tuning said system from one end of said band to the other and including a signal-responsive device for retaining an indication of the amplitude of the signal of said group which has the greatest field strength, a manually operable device, and automatic means controlled by said first-named means in accordance with said indication and responsive to the repeated operation of said device for automatically and successively tuning said system for the reception of different ones of said signals having progressively different frequencies and having amplitudes greater than a predetermined portion of said indicated amplitude.

11. In a wave signal receiving system which includes automatic gain control means and is tunable over a predetermined frequency band to receive any one of a group of signals having frequencies within said band, means for tuning said system from one end of said band to the other, means controlled by said gain control means incident to and simultaneously with said tuning operation for initially receiving and thereafter retaining an indication of a predetermined level of signal field strength which is proportional to the field intensity of the signal of greatest field strength included in said group, and means including a device controlled in accordance with the indication received by said last-named means for automatically tuning said system for the reception of any signal in said group having a field strength above said predetermined level.

12. In a wave signal receiving system which is tunable over a predetermined frequency band to receive any one of a group of signals having frequencies within said band, means for tuning said system from one end of said band to the other, means controlled incident to and simultaneously with said tuning operation to receive and retain an indication of a predetermined level of signal strength which is proportional to the signal strength of the strongest signal of said group, and means including a device controlled in accordance with the indication received by said last-named means for automatically tuning said system for the reception of any signal of said group having a signal strength above said predeter-level.

13. In a wave signal receiving system which is tunable over a predetermined frequency band having a number of signal channels therein, means for tuning said system from one end of said band to the other and for then retuning the system, and electrical means controlled to receive and retain an indication of the signal level of the strongest signal within said band incident to and simultaneously with the tuning of said system from said one end of said band to the other and operative to arrest said retuning operation when said predetermined signal is received.

14. In a wave signal receiving system which is tunable over a predetermined frequency band having a number of signal channels therein, means for tuning said system from one end of said band to the other and for then reversely tuning the system back toward said one end of said band, means for selecting and retaining an indication of the signal level of the strongest signal from said band incident to and simultaneously with the tuning of said system from said one end of said band to the other, and means controlled by said last-named means for automatically arresting the reverse tuning operation when said system is tuned to receive said predetermined signal.

15. In a wave signal receiving system which is tunable over a predetermined frequency band, automatic frequency control means adapted when operative automatically to maintain said system tuned to receive a selected signal, means for tuning the system from one end of said band to the other end and for then reversely tuning the system back toward said one end of said band, an automatic device effective during the tuning of said system from said one end of the band toward the other end thereof for memorizing a signal within the band having a predetermined distinguishing characteristic, means controlled by said signal memorizing device for automatically arresting the operation of said tuning means when said system is reversely tuned to select said predetermined signal within said band, and means operative in response to the selection of said signal for rendering said automatic frequency control means operative to maintain the system tuned to receive said selected signal.

16. In a wave signal receiving system which includes a signal translating device and is tunable over a predetermined frequency band, automatic frequency control means adapted when operative automatically to maintain said system tuned to receive a selected signal, means for tuning the system from one end of said band to the other end and for then reversely tuning the system back toward said one end of said band, an automatic device effective during the tuning of said system from said one of the band toward the other end thereof for memorizing a signal within the band having a predetermined distinguishing characteristic, means controlled by said signal memorizing device for automatically arresting the operation of said tuning means when said system is reversely tuned to select said predetermined signal within said band, muting means for preventing signal translation by said signal translating device during said tuning and retuning operations and controlled by said last-named means to permit translation of said predetermined signal, and means operative in response to the selection of said signal for rendering said automatic frequency control means operative to maintain the system tuned to receive said selected signal.

17. In a wave signal receiving system which is tunable over a predetermined frequency band, automatic frequency control means adapted when operative automatically to maintain the system tuned to receive a selected signal, means for tuning said system from one end of said band to the other end and for then reversely tuning the system back toward said one end of said band, means for automatically memorizing the strength of the signal having the greatest signal strength within said band incident to and simultaneously with the tuning of said system from said one end of said band to the other, and means controlled by said last-named means for automatically arresting the reverse tuning operation when said system is tuned to receive said signal having said greatest signal strength and for concurrently rendering said automatic frequency control means operative to maintain the system tuned to receive said selected signal of greatest field strength.

18. In a wave signal receiving system which includes a signal translating device and is tunable over a predetermined frequency band, automatic frequency control means adapted when operative automatically to maintain the system tuned to receive a selected signal, means for tuning said system from one end of said band to the other end and for then reversely tuning the system back toward said one end of said band, means for automatically memorizing the strength of the signal having the greatest signal strength within said band incident to and simultaneously with the tuning of said system from said one end of said band to the other, means controlled by said last-named means for automatically arresting the reverse tuning operation when said system is tuned to receive said selected signal having said greatest signal strength and for concurrently rendering said automatic frequency control means operative to maintain the system tuned to receive said signal of greatest field strength, and muting means for preventing signal translation by said device during said tuning and retuning operations and controlled by said last-named means to permit translation of said selected signal of greatest field strength.

19. In a radio receiving system which is tunable over a predetermined frequency band to receive any one of a group of signals, means for tuning said system from one end of said band to the other and including an automatic memory device effective simultaneously with such tuning for retaining an indication of the field strength of at least one of the signals in said group, a control device adapted for repeated operation, and automatic means controlled by said memory device in accordance with said indication and responsive to the repeated operation of said control device for automatically and successively tuning said system for the reception of different ones of said signals having field strengths above a predetermined portion of said indicated field strength.

20. In a wave signal receiving system which is tunable over a predetermined frequency band having a number of signal channels therein, means for tuning said system from one end of said band to the other and for then retuning the system over at least a portion of said band, means for automatically memorizing the amplitude of a predetermined signal from said band incident to and simultaneously with the tuning of said system from said one end of said band to the other, means controlled by said last-named means for automatically arresting the retuning operation when said system is tuned to receive a signal having the amplitude of said predetermined signal, and means for muting said system against signal reproduction during said tuning and retuning operations.

21. In a wave signal receiving system which is tunable over a frequency band to receive any one of a group of signals, means for scanning said group of signals and for then tuning said system over at least a portion of said band, means responsive to said signal scanning means and including an automatic memory device for memorizing a distinguishing characteristic of a predetermined signal from said group during said scanning operation, and means controlled by said memory device for automatically arresting the tuning of said system when said system is tuned to receive said predetermined signal.

22. In a wave signal receiving system which includes signal translating means and is tunable over a frequency band to receive any one of a group of signals, means for scanning said group of signals and for then tuning said system over at least a portion of said band, means for automatically memorizing a distinguishing characteristic of a predetermined signal from said group during said scanning operation, means controlled by said last-named means for automatically arresting the tuning of said system when said system is tuned to receive said predetermined signal, and muting means for preventing signal translation in said system by said signal translating means during said tuning operation.

23. In a wave signal receiving system which includes automatic gain control means and is tunable over a frequency band to receive any one of a group of signals, means for scanning said group of signals, and for then tuning said system over at least a portion of said band, means controlled by said automatic gain control means for memorizing a distinguishing characteristic of a predetermined signal from said group during said scanning operation, and means controlled by said last-named means for automatically arresting the tuning of said system when said system is tuned to receive said predetermined signal.

24. In a wave signal receiving system which includes automatic gain control means and is tunable over a frequency band to receive any one of a group of signals, means for scanning said group of signals and for then tuning said system over at least a portion of said band, means controlled by said automatic gain control means for memorizing a distinguishing charactertistic of a predetermined signal from said group during said scanning operation, and means jointly controlled by said gain control means and said last-named means for automatically arresting the tuning of said system when said system is tuned to receive said predetermined signal.

25. In a wave signal receiving system which includes automatic gain control means and is tunable over a predetermined frequency band to receive any one of a plurality of signals, means for tuning said system from one end of said band to the other and for then retuning the system over at least a portion of said band, means controlled by said automatic gain control means for memorizing a distinguishing characteristic of a predetermined signal from said plurality of signals incident to and simultaneously with the tuning of said system from said one end of said band to the other, and means controlled by said last-named means for automatically arresting the retuning operation in response to the reception of a signal having said distinguishing characteristics of said predetermined signal.

WILLIAM L. EVERITT.

REFERENCES CITED

The following references are of record in the file of this patent:

UNITED STATES PATENTS

| Number | Name | Date |
|---|---|---|
| 2,112,687 | Barton | Mar. 29, 1938 |
| 2,217,293 | Quinby | Oct. 8, 1940 |
| 2,240,428 | Travis | Apr. 29, 1941 |
| 2,262,218 | Andrews | Nov. 11, 1941 |
| 2,326,737 | Andrews | Aug. 17, 1943 |
| 2,426,580 | O'Brien | Aug. 26, 1947 |